United States Patent
Ning et al.

(10) Patent No.: US 8,557,693 B2
(45) Date of Patent: Oct. 15, 2013

(54) CONTACT RESISTIVITY REDUCTION IN TRANSISTOR DEVICES BY DEEP LEVEL IMPURITY FORMATION

(75) Inventors: Tak Hung Ning, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 12/793,046

(22) Filed: Jun. 3, 2010

(65) Prior Publication Data
US 2011/0298056 A1   Dec. 8, 2011

(51) Int. Cl.
*H01L 21/22* (2006.01)

(52) U.S. Cl.
USPC .............. 438/543; 438/530; 257/384

(58) Field of Classification Search
None
See application file for complete search history.

(56) References Cited

U.S. PATENT DOCUMENTS

| | | | |
|---|---|---|---|
| 6,238,945 B1 | 5/2001 | Kaneko | |
| 6,265,291 B1 | 7/2001 | Yu et al. | |
| 6,972,250 B2 | 12/2005 | Cabral, Jr. et al. | |
| 7,449,353 B2 | 11/2008 | Saxler | |
| 7,626,217 B2 | 12/2009 | Saxler | |
| 2007/0228401 A1 | 10/2007 | Machida et al. | |
| 2009/0134388 A1* | 5/2009 | Yamauchi et al. | 257/42 |

* cited by examiner

*Primary Examiner* — Johannes P Mondt
(74) *Attorney, Agent, or Firm* — Cantor Colburn LLP; Louis Percello

(57) ABSTRACT

A method of forming a low resistance contact structure in a semiconductor device includes forming a doped semiconductor region in a semiconductor substrate; forming a deep level impurity region at an upper portion of the doped semiconductor region; activating dopants in both the doped semiconductor region and the deep level impurity region by annealing; and forming a metal contact over the deep level impurity region so as to create a metal-semiconductor interface therebetween.

28 Claims, 5 Drawing Sheets

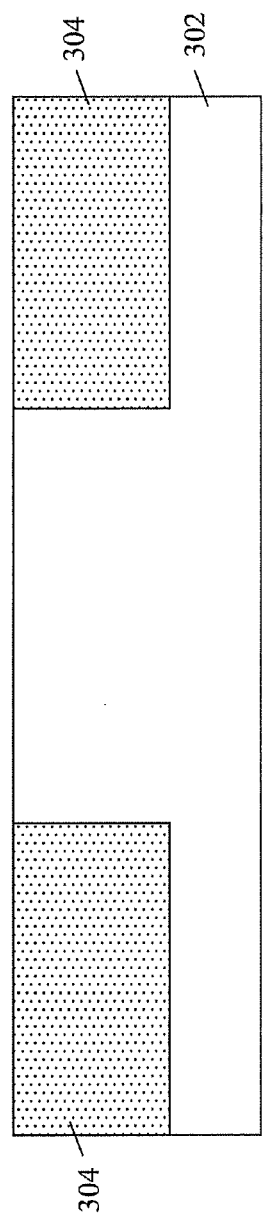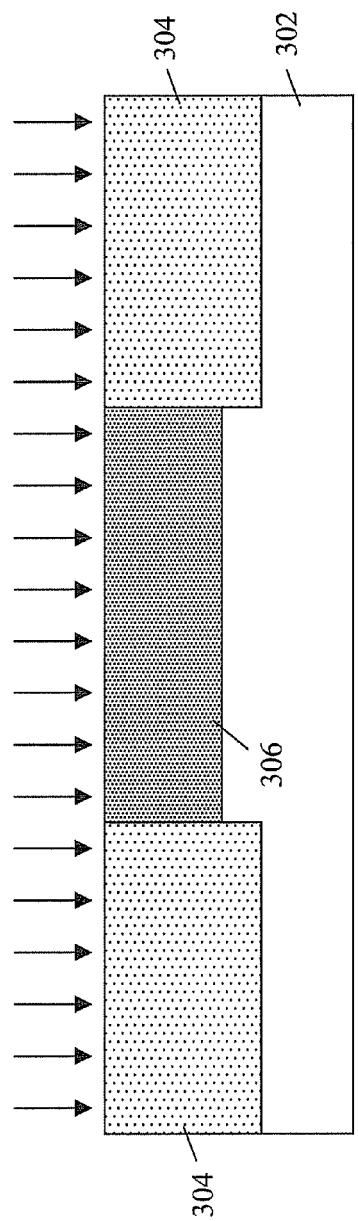
Figure 3(a)
Figure 3(b)

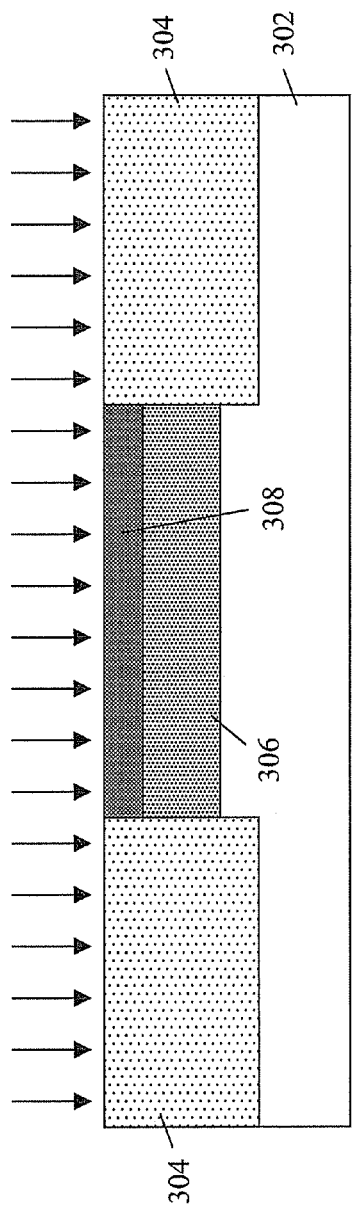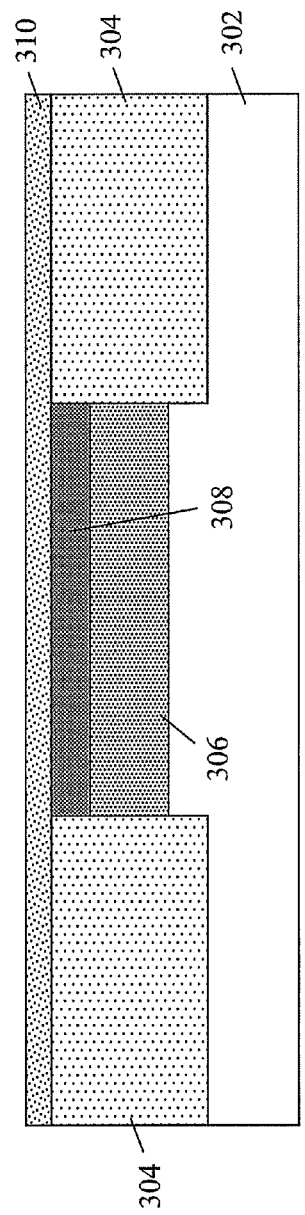
Figure 3(c)
Figure 3(d)

CONTACT RESISTIVITY REDUCTION IN TRANSISTOR DEVICES BY DEEP LEVEL IMPURITY FORMATION

BACKGROUND

The present invention relates generally to semiconductor device manufacturing and, more particularly, to contact resistivity reduction in transistor devices by deep level impurity formation.

Integrated circuits (ICs) include a multitude of transistors formed on a semiconductor substrate. Transistors such as, for example, metal oxide semiconductor field effect transistors (MOSFETs) are generally built on the top surface of a bulk substrate. The substrate is doped to form impurity-diffusing layers (i.e., source and drain regions). Located between the source and drain regions is a conductive layer, separated by a thin dielectric layer, which operates as a gate for the transistor. The gate controls current in a channel formed between the source and the drain regions.

In order to reduce series resistance associated with the source and drain regions of a MOSFET, semiconductor manufacturers employ a self-aligned silicide or "salicide" process also known as silicidation. Typically, silicidation is accomplished by depositing a refractory metal (e.g., cobalt (Co), titanium (Ti), nickel (Ni), platinum (Pt), tungsten (W), etc.) onto an exposed surface of source and drain regions in a semiconductor substrate. During an annealing process, the atoms of silicon (Si) in the source and drain regions react with the atoms of the refractory metal, thereby forming a silicide layer. Those portions of the refractory metal on insulating regions remain unreacted and can be selectively removed. The remaining layer of silicide reduces the contact resistance at the silicide source/drain junction by helping break through the residual surface oxide so that good electrical contact can be made.

Silicon MOSFET scaling requires the continuous reduction of the gate length, gate dielectric thickness, and higher substrate doping. As these parameters improve, the intrinsic device resistance scales below $1000\Omega$-$\mu m$, leading to faster devices. However, as such devices scale down in size, the silicide material used to contact the source and drain regions becomes an increasingly limiting factor on device speed with respect to the parasitic contact resistance of silicide-to-silicon in the source/drain (S/D) contacts. This is because minimizing the silicide interface resistivity depends mainly on maximizing the S/D doping level, which is already at saturation levels in current CMOS technology.

Accordingly, as devices scale smaller, the contact resistance only increases as the silicide/silicon contact area becomes smaller. Thus, not only in relative terms, but also in absolute terms, the contact resistance increases as devices scale below 0.1 $\mu m$, which in turn places a severe limitation on potential device improvement obtained by scaling other parameters.

SUMMARY

In an exemplary embodiment, a method of forming a low resistance contact structure in a semiconductor device includes forming a doped semiconductor region in a semiconductor substrate; forming a deep level impurity region at an upper portion of the doped semiconductor region; activating dopants in both the doped semiconductor region and the deep level impurity region by annealing; and forming a metal contact over the deep level impurity region so as to create a metal-semiconductor interface therebetween.

In another embodiment, a low resistance contact structure in a semiconductor device includes a doped semiconductor region formed in a semiconductor substrate; a deep level impurity region formed at an upper portion of the doped semiconductor region; and a metal contact formed over the deep level impurity region so as to create a metal-semiconductor interface therebetween.

In another embodiment, a method of forming a low resistance contact structure in a field effect transistor (FET) device includes forming a doped source/drain region in a silicon substrate; forming a deep level impurity region at an upper portion of the doped source/drain region; and forming a silicide metal contact over the deep level impurity region to create a metal-silicon interface; wherein the deep level impurity region has a depth greater than or equal to a depletion width of the doped source/drain region, which corresponds to a band-bending region of the metal-silicon interface.

In still another embodiment, a low resistance contact structure in a field effect transistor (FET) device includes a doped source/drain region formed in a silicon substrate; a deep level impurity region formed at an upper portion of the doped source/drain region; and a silicide metal contact formed over the deep level impurity region so as to create a metal-silicon interface therebetween; wherein the deep level impurity region has a depth greater than or equal to a depletion width of the doped source/drain region, which corresponds to a band-bending region of the metal-silicon interface.

BRIEF DESCRIPTION OF THE SEVERAL VIEWS OF THE DRAWINGS

Referring to the exemplary drawings wherein like elements are numbered alike in the several Figures:

FIGS. 3(a) through 3(e) are a series of cross sectional views illustrating a method of forming a metal-to-semiconductor contact with reduced resistivity using deep level impurity doping, in accordance with an embodiment of the invention.

DETAILED DESCRIPTION

Disclosed herein is a method and structure for reducing contact resistivity in transistor devices such as MOSFETs. In brief, conventional source/drain implants are supplemented with an upper layer comprising a deep impurity implant species (i.e., deep level donors for n-type contacts and deep level acceptors for p-type contacts) so as to provide an additional current path at the metal/semiconductor interface.

Figures 1A, 1B:
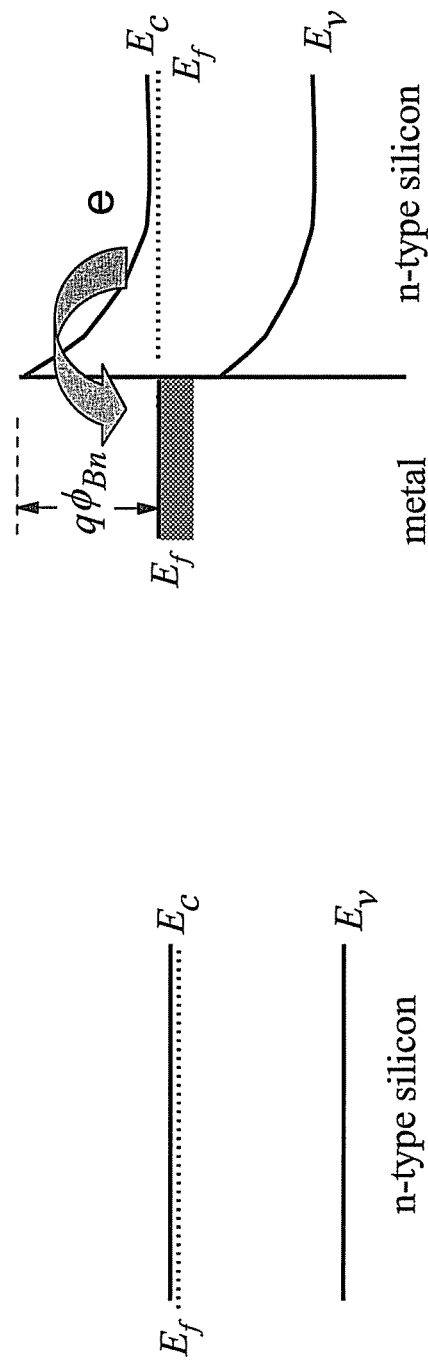
FIG. 1(a) is an energy band diagram for an n-type semiconductor device such as silicon.
FIG. 1(b) is an energy band diagram for a metal/n-type silicon interface, illustrating the formation of a Schottky barrier.

As indicated above, source/drain contact resistance becomes more and more dominating with device scaling. Referring initially to FIGS. 1(a) and 1(b), an energy band diagram for an n-type semiconductor device such as silicon, and an energy band diagram for a high workfunction metal to heavily doped n-type silicon contact are respectively shown. Whenever a metal is deposited onto a semiconductor, the Fermi levels match at the interface thereof. Thus, as shown in the band diagram of FIG. 1(b), a Schottky barrier is formed at the metal/Si interface, where electrons tunneling between metal and silicon see a barrier height represented by $(E_c-E_f)$ at the interface.

Figures 2A, 2B:
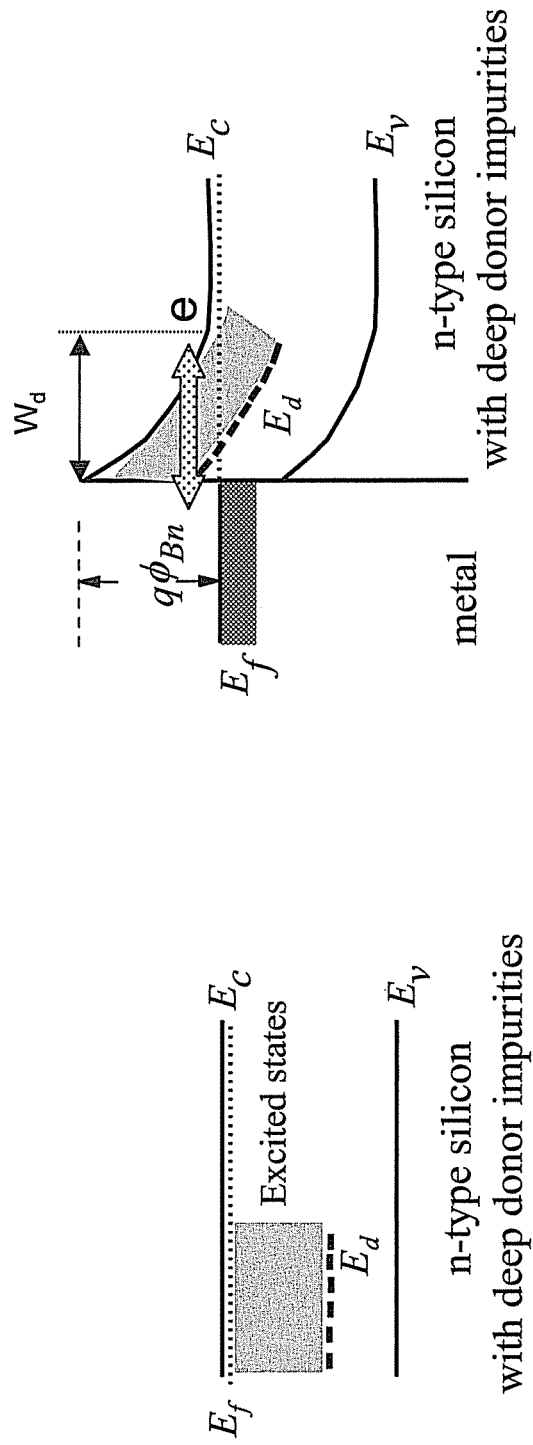
FIG. 2(a) is an energy band diagram for an n-type semiconductor device having a deep donor implantation therein.
FIG. 2(b) is an energy band diagram for a metal/n-type silicon interface, with the n-type silicon having a deep donor implantation therein so as to provide an extra tunneling path for electrons.

Accordingly, in the present embodiments, deep level impurities are added in a thin Si layer adjacent the Si surface so as to provide an extra current path at the metal/Si interface. In particular, deep level donors for n-type contacts and deep level acceptors for p-type contacts are added. FIGS. 2(a) and 2(b) are band diagrams illustrating the mechanisms of deep donor impurities n-type Si, and in a metal/Si (n-type) junction, respectively. As shown in FIG. 2(a), when the deep donor concentration in n-type Si is sufficiently high, an impurity energy band at energy $E_d$ and continuous excited states above $E_d$ are formed near the interface.

Thus, electrons tunneling between metal and n-type silicon see a barrier height represented by $(E_d-E_f)$ at the interface, as shown in FIG. 2(b). Here, the deep level energy band and the excited states effectively provide an extra tunneling path for the electrons. In an exemplary embodiment, the thickness of the layer with deep level impurities should be equal to or larger than the depletion width $W_d$, or the width of the band-bending region. With the thickness of the deep level impurity layer thicker than the band-bending region, the deep level impurity layer overlaps with the quasineutral or non band-bending region, thus facilitating the transport of electrons from the quasineutral region to the deep level impurity layer. In one specific implementation, $W_d$ is less than about 10 nanometers (nm) when the Si doping level is on the order of about $10^{20}$ atoms/cm$^3$, and more generally on the order of about $10^{19}$ atoms/cm$^3$ to about $10^{22}$ atoms/cm$^3$. In this example, it should be noted that the resulting depth of the deep level impurity layer corresponds to the remaining depth of the impurity layer beneath the silicon/silicide interface (post silicidation) and not the original implanted depth of the deep level impurities, as some of the implanted silicon is consumed during the silicide process.

It is contemplated that the deep impurity technique proposed herein is applicable to group IV semiconductors (e.g., Si, germanium (Ge), silicon germanium (SiGe), etc.) as well as to group III-V semiconductors (e.g., gallium arsenide (GaAs), gallium nitride (GaN), aluminum phosphide (AlP), aluminum arsenide (AlAs), etc.) With respect to deep donor impurities, those materials from groups VI and VII impurities are good candidates for deep donors. As compared to more conventional group V donors (e.g., arsenic (As) and phosphorus (P)), group VI and group VII donors have a ground state energy deeper below the conduction-edge. For example, in the case of the group VI donor sulfur (S), the ionization energy for the first electron of S is about the same as those of As and P. However, the ionization energy for the second electron of S takes more energy, thus making S a deep donor.

The ground state of S is 0.6 electron volts (eV) relative to the conduction band edge $E_c$, while the Schottky barrier height (SBH) of NiSi is 0.7 eV relative to $E_c$. Thus, the effective barrier height for electron transportation adjusted by deep level S impurities may be as low as 0.1 eV. In one specific example, sulfur/selenium (S/Se) induced SBH lowering to NiSi contacts have been demonstrated.

With respect to deep acceptor impurities, materials from groups I and II are good candidates for deep acceptors (e.g., sodium (Na), potassium (K), magnesium (Mg), calcium (Ca)).

Figure 3E:
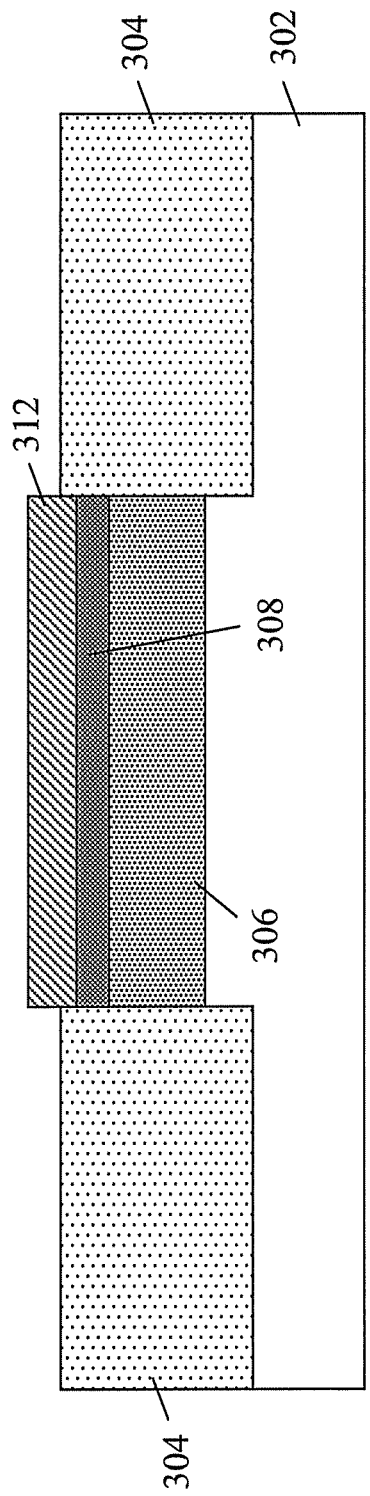

Referring now to FIGS. 3(a) through 3(e), there is shown a series of cross sectional views illustrating a method of forming a metal-to-semiconductor contact with reduced resistivity using deep level impurity doping, in accordance with an embodiment of the invention. As shown in FIG. 3(a), a starting contact structure includes a semiconductor substrate 302. The semiconductor substrate 302 may comprise, as indicated above, a group IV semiconductor such as Si, Ge, SiGe, etc., or group III-V semiconductor compound such as GaAs, GaN, AlP, AlAs, etc. In addition, FIG. 3(a) illustrates a pair of insulating regions 304, such as shallow trench isolation (STI) regions, that electrically isolate the contact from other integrated circuit device structures (not shown). The insulating regions may be, for example, an oxide of silicon.

As then shown in FIG. 3(b), the structure is subjected to a first dopant species implant process in accordance with the polarity of the device to be formed, thereby forming a doped semiconductor region 306 between the insulating regions 304. For example, in an FET structure, the doped semiconductor region 306 could be a source/drain region. The polarity of the contact (e.g., n-type or p-type) determines the type of dopant species implanted in FIG. 3(b). For a group IV intrinsic semiconductor, the dopant species may be, for example, P or As for an n-type contact region, or B or Al for a p-type contact region.

Then, in FIG. 3(c), the structure is subjected to a second dopant species implant process concentrated at an upper portion of the doped semiconductor region 306 so as to create a deep level impurity region 308 therein. In the case that the doped semiconductor region 306 is an n-type region, then the deep level impurity region 308 comprises deep level donor atoms that may be selected from groups VI and VII. On the other hand, where the doped semiconductor region 306 is a p-type region, then the deep level impurity region 308 comprises deep level acceptor atoms that may be selected from groups I and II. In any case, the implant process conditions are preferably selected such that the resulting thickness or depth of the deep level impurity region is equal to or slightly greater than the depletion width of the doped semiconductor region 306. Again, the depletion width is in turn determined by the concentration of the dopant atoms in the doped semiconductor region 306. Once the deep level impurity region 308 is implanted, then both the doped semiconductor region 306 and the deep level impurity region 308 may then be activated by an annealing process.

FIG. 3(d) illustrates the deposition of a refractory metal layer 310 (e.g., Co, Ti, Ni, Pt, W, etc.) over both the insulating regions 304 and the deep level impurity region 308. The resulting structure is subjected to a thermal anneal so as to react the refractory metal with the semiconducting deep level impurity region 308, forming a metal silicide contact structure 312, as shown in FIG. 3(e). Those portions of the refractory metal layer 310 formed over the insulating regions 304 do not react therewith during the anneal, and are selectively removed as illustrated by the resulting structure in FIG. 3(e).

As a result of the presence of the deep level impurity region 308, the metal-to-semiconductor interface between the metal silicide contact structure 312 and the deep level impurity region 308, an extra current path is provided at this interface as a result of the induced SBH lowering. In turn, the contact resistance may become less of a factor as device sizes continue to scale.

Finally, the above described technique may be more specifically utilized in a CMOS process, by using deep level donors for the n+ source and drain contacts and deep level acceptors for the p+ source and drain contacts. Optionally, a single silicide metal may be used for gate, source and drain contact regions for both the NFET devices and the PFET devices, resulting in low contact resistivity for both polarity types.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a contact structure in a semiconductor device, the method comprising:
    forming a doped semiconductor region in a semiconductor substrate;
    forming a deep level impurity region at an upper portion of the doped semiconductor region, thereby defining a layer of deep level impurities having a thickness;
    activating dopants in both the doped semiconductor region and the deep level impurity region by annealing; and
    forming a metal contact over the deep level impurity region so as to create a metal-semiconductor interface between the metal contact and the deep level impurity region, thereby providing an extra current path at the metal-semiconductor interface;
    wherein the thickness of the layer of deep level impurities is equal to or larger than a depletion width, $W_d$, corresponding to a band-bending region of the doped semiconductor region.

2. The method of claim 1, wherein:
    the doped semiconductor region is n-type; and
    the deep level impurity region comprises a deep level donor region.

3. The method of claim 2, further comprising forming the deep level donor region by implantation of species taken from one or more of group VI and VII elements.

4. The method of claim 3, wherein:
    the substrate is silicon; and
    the doped semiconductor region is doped to a concentration of about $10^{20}$ dopant atoms/cm$^3$.

5. The method of claim 1, wherein:
    the doped semiconductor region is p-type; and
    the deep level impurity region comprises a deep level acceptor region.

6. The method of claim 5, further comprising forming the deep level acceptor region by implantation of species taken from one or more of group I and II elements.

7. The method of claim 5, wherein:
    the substrate is silicon; and
    the doped semiconductor region is doped to a concentration of about $10^{19}$ atoms/cm$^3$ to about $10^{22}$ atoms/cm$^3$.

8. The method of claim 1, wherein the metal contact is a metal silicide contact formed by depositing a refractory metal over the deep level impurity region and annealing to convert the refractory metal and a portion of the deep level impurity region to a metal silicide.

9. A contact structure in a semiconductor device comprising:
    a doped semiconductor region formed in a semiconductor substrate;
    a deep level impurity region formed at an upper portion of the doped semiconductor region, thereby defining a layer of deep level impurities having a thickness; and
    a metal contact formed over the deep level impurity region so as to create a metal-semiconductor interface between the metal contact and the deep level impurity region, thereby providing an extra current path at the metal-semiconductor interface;
    wherein the thickness of the layer of deep level impurities is equal to or larger than a depletion width, $W_d$, corresponding to a band-bending region of the doped semiconductor region.

10. The structure of claim 9, wherein:
    the doped semiconductor region is n-type; and
    the deep level impurity region comprises a deep level donor region.

11. The structure of claim 10, wherein the deep level donor region comprises a species taken from one or more of group VI and VII elements.

12. The structure of claim 11, wherein:
    the substrate is silicon; and
    the doped semiconductor region is doped to a concentration of about $10^{19}$ atoms/cm$^3$ to about $10^{22}$ atoms/cm$^3$.

13. The structure of claim 9, wherein:
    the doped semiconductor region is p-type; and
    the deep level impurity region comprises a deep level acceptor region.

14. The structure of claim 13, wherein the deep level acceptor region is formed by implantation of species taken from one or more of group I and II elements.

15. The structure of claim 14, wherein:
    the substrate is silicon; and
    the doped semiconductor region is doped to a concentration of about $10^{19}$ atoms/cm$^3$ to about $10^{22}$ atoms/cm$^3$.

16. The structure of claim 9, wherein the metal contact is a metal silicide contact.

17. A method of forming a contact structure in a field effect transistor (FET) device, the method comprising:
    forming a doped source/drain region in a silicon substrate;
    forming a deep level impurity region at an upper portion of the doped source/drain region, thereby defining a layer of deep level impurities having a thickness; and
    forming a silicide metal contact over the deep level impurity region to create a metal-silicon interface between the metal contact and the deep level impurity region, thereby providing an extra current path at the metal-semiconductor interface;
    wherein the thickness of the layer of deep level impurities is greater than or equal to a depletion width of the doped source/drain region, which corresponds to a band-bending region of the metal-silicon interface.

18. The method of claim 17, wherein:
    the doped source/drain region is n-type; and
    the deep level impurity region comprises a deep level donor region formed by implantation of species taken from one or more of group VI and VII elements.

19. The method of claim 18, wherein the deep level donor region species comprises one or more of sulfur (S) and selenium (Se).

20. The method of claim 17, wherein:
    the doped source/drain region is p-type; and
    the deep level impurity region comprises a deep level acceptor region formed by implantation of species taken from one or more of group I and II elements.

21. The method of claim 20, wherein the deep level acceptor region species comprises one or more of sodium (Na), potassium (K), magnesium (Mg), and calcium (Ca).

22. A contact structure in a field effect transistor (FET) device, comprising:
    a doped source/drain region formed in a silicon substrate;

a deep level impurity region formed at an upper portion of the doped source/drain region, thereby defining a layer of deep level impurities having a thickness; and a silicide metal contact formed over the deep level impurity region so as to create a metal-silicon interface between the metal contact and the deep level impurity region, thereby providing an extra current path at the metal-semiconductor interface;

wherein the thickness of the layer of deep level impurities is greater than or equal to a depletion width of the doped source/drain region, which corresponds to a band-bending region of the metal-silicon interface.

23. The structure of claim 22, wherein:

the doped source/drain region is n-type; and the deep level impurity region comprises a deep level donor region formed by implantation of species taken from one or more of group VI and VII elements.

24. The structure of claim 23, wherein the deep level donor region species comprises one or more of sulfur (S) and selenium (Se).

25. The structure of claim 22, wherein:

the doped source/drain region is p-type; and the deep level impurity region comprises a deep level acceptor region formed by implantation of species taken from one or more of group I and II elements.

26. The structure of claim 25, wherein the deep level acceptor region species comprises one or more of sodium (Na), potassium (K), magnesium (Mg), and calcium (Ca).

27. The method of claim 1, wherein the deep level impurity region is formed prior to forming the metal contact.

28. The method of claim 17, wherein the deep level impurity region is formed prior to forming the silicide metal contact.

* * * * *